(12) United States Patent
Meyer et al.

(10) Patent No.: US 6,794,872 B2
(45) Date of Patent: Sep. 21, 2004

(54) METHOD FOR DETERMINING THE POSITION OF A LOCAL ANTENNA IN AN MR SYSTEM

(75) Inventors: Heiko Meyer, Dormitz (DE); Jianmin Wang, ShenZhen (CN)

(73) Assignee: Siemens Aktiengesellschaft, Münich (DE)

( * ) Notice: Subject to any disclaimer, the term of this patent is extended or adjusted under 35 U.S.C. 154(b) by 0 days.

(21) Appl. No.: 10/371,893

(22) Filed: Feb. 21, 2003

(65) Prior Publication Data

US 2003/0184292 A1 Oct. 2, 2003

(51) Int. Cl.$^7$ .................................................. G01V 3/00
(52) U.S. Cl. ...................................... 324/318; 324/309
(58) Field of Search ................................ 324/318, 322, 324/309, 307; 600/410, 417; 128/652.2

(56) References Cited

U.S. PATENT DOCUMENTS

| | | | |
|---|---|---|---|
| 5,271,400 A | * 12/1993 | Dumoulin et al. | 600/410 |
| 5,318,025 A | * 6/1994 | Dumoulin et al. | 600/417 |
| 5,365,927 A | * 11/1994 | Roemer et al. | 600/410 |
| 5,699,800 A | * 12/1997 | Heywang-Koebrunner | 600/567 |
| 5,936,406 A | * 8/1999 | Potthast | 324/318 |
| 6,034,529 A | 3/2000 | Kolem et al. | |

FOREIGN PATENT DOCUMENTS

EP  0 844 488  11/1997

* cited by examiner

Primary Examiner—Brij B. Shrivastav
(74) Attorney, Agent, or Firm—Schiff Hardin LLP

(57) ABSTRACT

In a method for determining the position of at least one local antenna in an examination space of a magnetic resonance (MR) system, magnetic resonance signals emitted by a body arranged in the examination space are received by the at least one local antenna location-encoded in at least one coordinate direction, intensity values that are spatially resolved in the coordinate direction are generated from the received magnetic resonance signals, and the position of the local antenna in the coordinate direction is determined from a curve of the intensity values along the coordinate direction, the intensity values having been subjected as needed to post-processing. The determination of the position of the local antenna ensues by adapting a function to the curve of the intensity values, the function being manipulable to approximate the shape of a sensitivity profile of the local antenna, and the position of a maximum of the adapted function is utilized as the position of the local antenna. A noise-insensitive determination of the position of local antennas with high precision is achieved.

10 Claims, 4 Drawing Sheets

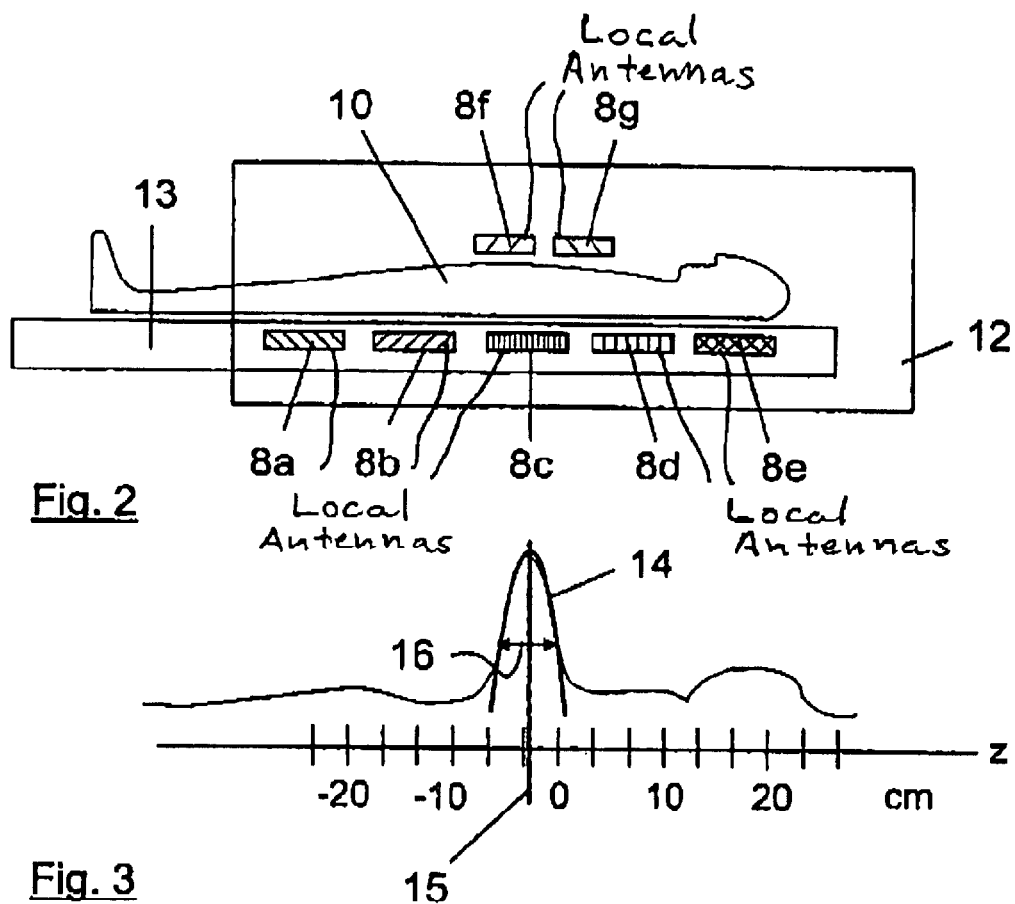
Fig. 2
Fig. 3
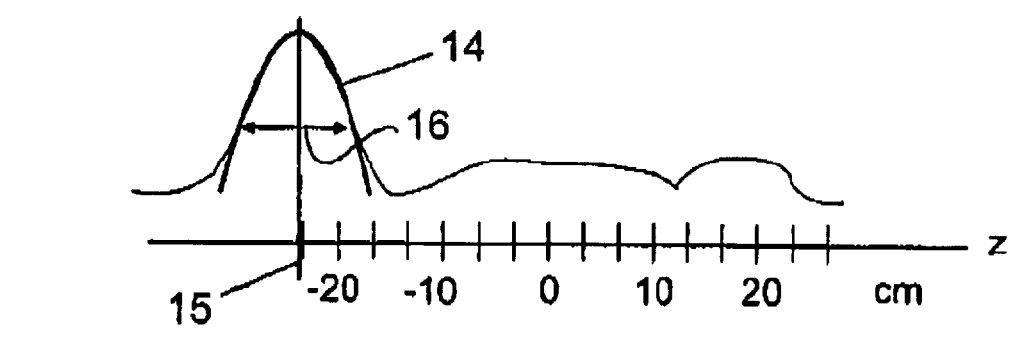
Fig. 4

METHOD FOR DETERMINING THE POSITION OF A LOCAL ANTENNA IN AN MR SYSTEM

BACKGROUND OF THE INVENTION

1. Field of the Invention

The present invention is directed to a method for determining the position of at least one local antenna in an examination space of a magnetic resonance system, of the type wherein magnetic resonance signals emitted by a body arranged in the examination space are received by the local antenna encoded as to location in at least one coordinate direction, and wherein intensity values that are spatially resolved in the coordinate direction are generated from the received magnetic resonance signals, and wherein the position of the local antenna is determined from a curve of the intensity values along the coordinate direction, the intensity values possibly having been subjected to a post-processing.

2. Description of the Prior Art

Magnetic resonance tomography is a known technology for acquiring images of the inside of the body of a living examination subject. For implementing magnetic resonance tomography, a basic field magnet generates a static, relatively homogeneous basic magnetic field. During the registration of magnetic resonance images, rapidly switched gradient fields, which are generated by gradient coils, are superimposed on this basic magnetic field. Radio-frequency transmission antennas are used to emit radio-frequency pulses for triggering magnetic resonance signals into the examination subject arranged in the examination space of the magnetic resonance system. The location-encoded magnetic resonance signals triggered by these radio-frequency pulses are picked up by radio-frequency reception antennas. The magnetic resonance images of the examined subject region of the examination subject are produced on the basis of these magnetic resonance signals received with the reception antennas. Every picture element in the magnetic resonance image thereby corresponds to an intensity value of a received magnetic resonance signal of a small body volume. Whole-body radio-frequency antennas usually are employed as radio-frequency transmission antennas. These whole-body radio-frequency antennas also are suitable as reception antennas for the magnetic resonance signals. They exhibit a very uniform sensitivity profile but leads to a signal-to-noise ratio that is unfavorable for many applications. Local antennas are employed for improving the signal-to-noise ratio. These are antennas that are adapted to the size of the body region to be examined. For example, local antennas are known that are permanently installed in the patient table (bed) or latched to fixed positions at the patient bed for examining the spinal column or for examining the head. In addition to these local antennas that can be positioned in a fixed fashion, freely movable local antennas are also utilized in many applications; the operator of the magnetic resonance system, for example, merely places these onto the body region to be examined.

It is important for a high signal-to-noise ratio in magnetic resonance exposures with such local antennas that the antenna be located as close as possible to the imaging region of the body. When a number of local antennas are available, then only one of these antennas that is located closest to the region to be examined should be activated for the reception during the measurement under certain circumstances. Artifacts such as, for example, folds in the magnetic resonance image are avoided or at least reduced in this way. This, however, requires exact knowledge of the position of the local antennas in the examination space relative to the body region to be examined. However, there is no fixed reference to the magnet system of the magnetic resonance system in employment of local antennas or local coils that can be freely positioned, for example surface coils.

European Application 0 844 488 discloses a method for acquiring the position of a medical instrument equipped with local antennas in an examination space of a magnetic resonance system. To this end, the medical instrument has at least two positioning elements at the local antennas that are provided with magnetic resonance signal sources. The orientation of these positioning elements is acquired with a magnetic resonance pre-measurement and is mixed into the magnetic resonance image of the subsequent imaging magnetic resonance measurement of the body region under examination. The magnetic resonance signal sources thereby enable the determination of the position of the local antennas integrated in the instrument relative to the region under examination. If there is an unfavorable selection of the pick-up region, however, these signal sources can fold into the diagnostic image. A separate transmission and reception branch that is sensitive to a different frequency would have to be available for the pre-measurement information in order to avoid this folding.

U.S. Pat. No. 6,034,529 likewise discloses a method for determining the position of a local antenna in an examination space of a magnetic resonance system that is implemented similar to that of European Application 0 844 488. In this technique, too, the local antenna contains an additional magnetic resonance signal source that can be seen in a magnetic resonance image acquired with a suitable measurement sequence. In this publication, however, the signal source is selected such that its gyromagnetic constant deviates sufficiently from the gyromagnetic constant of protons. This results in the additional magnetic resonance signal source is not visible in the magnetic resonance image of the actual diagnostic measurement. However, this method also requires the use of special local antennas that form the corresponding magnetic resonance signal sources.

German PS 196 53 535 discloses a method for determining the position of at least one local antenna in an examination space of a magnetic resonance system. Magnetic resonance signals emitted by a body arranged in the examination space are received location-encoded in at least one coordinate direction by the local antenna, and intensity values that are spatially resolved in the coordinate direction are generated from the received magnetic resonance signals. Simultaneously, the emitted magnetic resonance signals are received by an antenna that has a uniform sensitivity profile and are converted into corresponding spatially resolved intensity values. By normalization onto the intensity values obtained with the antenna having a uniform intensity distribution, normalized intensity values are formed from the intensity values obtained with the local antenna. A maximum value that indicates the position of the local antenna in a coordinate direction is identified from the curve of these normalized intensity values over the coordinate axis. This method thus does not require the use of additional magnetic resonance signal sources. Due to the noise components in the measured signals, however, the determination of the maximum of this curve is afflicted with error, so that a spatial smoothing or filtering of the intensity values must be implemented for enhancing the precision of the position identification. Such a filtering or smoothing, however, can still lead to imprecisions in the position identification. Moreover, an exact position identification is possible only with this technique when the middle of the local antenna is situated in the exposure volume. When this is not the case, then the position of this antenna is incorrectly identified.

SUMMARY OF THE INVENTION

An object of the present invention is to provide a method for determining the position of a local antenna in an examination space of a magnetic resonance system that enables an automatic determination of the position with high precision.

This object is achieved in accordance with the invention in a method wherein magnetic resonance signals emitted by a body arranged in the examination space are received location-encoded in at least one coordinate direction by the local antenna, and intensity values that are spatially resolved in the at least one coordinate direction are generated from the received magnetic resonance signals. The position of the local antenna in the coordinate direction is ultimately determined from the curve of the intensity values (subjected to as needed post-processing) along the coordinate direction. This determination is made by a curve fit, i.e. the adaptation or matching of a function to the curve of the intensity values along the coordinate direction. A function that can at least be approximated or adapted to the shape of a sensitivity profile of the local antenna is utilized for this. After the adaptation of this function to the curve, the position of the maximum of the function on the coordinate axis is utilized as the position of the local antenna.

The position of local antennas can be determined with high precision in at least one freely prescribable coordinate direction with the present method. The method is less susceptible to error, particularly less sensitive to noise influences, compared to the method according to German PS 196 53 535. A smoothing or filtering of the curve of the intensity values for enhancing the precision of the position identification is not required in the inventive method. A very dependable determination of the position of the antenna is achieved with high precision by taking the reception profile of the local antenna into consideration in the curve fit. The position of the antenna can also be correctly identified on the basis of this curve fit when the middle of this antenna is situated outside the exposure volume. Another considerable advantage is that the width of the sensitivity profile of the local antenna in the body under examination can be determined with respect to the respective coordinate direction from the width of the adapted function, for example from the half-width value or the 1/e width, as ensues in a preferred embodiment of the present method. The knowledge of this width of the sensitivity profile, also referred to below as the illumination width or illumination profile, is necessary in order to avoid artifacts which may arise in the magnetic resonance image.

A Gauss function, which is approximated to the sensitivity profile of many antenna or coil types preferably is utilized as adaptation or: matching function. Other functions can be utilized insofar as they can be at least approximately adapted to the sensitivity profile of the antennas.

The present method is preferably implemented in at least two coordinate directions, so that the position of the local antenna can be determined in a plane or in three-dimensional space.

Particular advantages are achieved from the position determination when a number of local antennas are simultaneously utilized in the magnetic resonance system, for example in the form of an antenna array. For example, the positions of the local antennas are employed for selecting one of the local antennas that supplies the best possible signal-to-noise ration, and thus the best resolution for a specific body region. This antenna selection can also ensue automatically. The determination of the position of a number of local antennas preferably ensues simultaneously by the magnetic resonance signals being simultaneously received by these local antennas and evaluated as described above for the determination of the positions of the respective local antennas. This, however, requires that the magnetic resonance system have a number of signal processing channels connected to the individual local antennas.

In another embodiment of the inventive method, the magnetic resonance signals are simultaneously received by an antenna with a uniform sensitivity profile, for example the whole-body antenna used for the emission of radio-frequency signals, and intensity values that are spatially resolved in coordinate direction are generated therefrom. The intensity values of the magnetic resonance signals received with the at least one local antenna are then normalized onto the intensity values of the antenna with the uniform sensitivity profile that are obtained for the same coordinate point. In this way, the influence on the curve of the intensity values over the coordinate axis caused by the body material is eliminated.

The position of the at least one local antenna obtained with the method preferably is mixed into a magnetic resonance overview image of the type usually generated before the implementation of a diagnostic magnetic resonance exposure. The illumination width of the respective local antenna that is determined from the width of the adapted function then can also be displayed in this overview exposure.

DESCRIPTION OF THE DRAWINGS

FIG. 2 is an example of the different positions of a number of local antennas in the examination space of a magnetic resonance system.

FIG. 3 is an example of the curve of the intensity values in a coordinate direction obtained with a local antenna according to the inventive method.

FIG. 4 is a further example of the curve of the intensity values in a coordinate direction obtained with a local antenna according to the inventive method.

DESCRIPTION OF THE PREFERRED EMBODIMENTS

Figure 1:
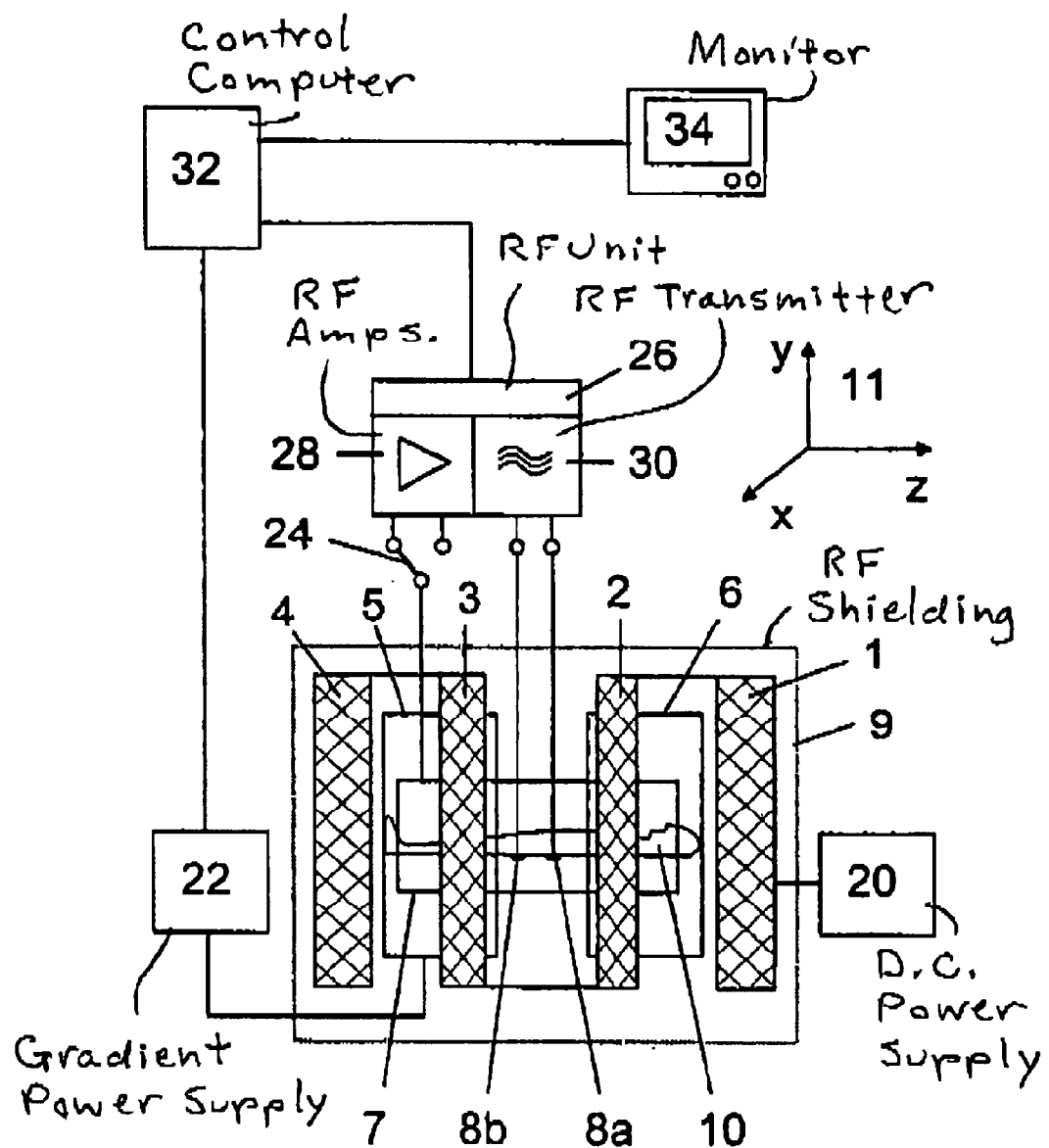
FIG. 1 shows the principal components of a magnetic resonance system shown in an overview.

FIG. 1 shows an overview of a magnetic resonance system with which anatomical tomograms and angiograms of the human body can be produced or with which functional examinations can be implemented. The magnetic resonance system has the coils 1 through 4 that generate a nearly homogeneous magnetic basic field having a high field strength in axial direction in an examination volume. For employment for medical diagnostics, a body region of a patient 10 to be examined is located in the examination volume. A gradient coil system for generating independent, auxiliary magnet fields in the direction of the basic magnetic field is allocated to the examination volume. As gradient fields, the auxiliary magnetic fields have mutually perpendicular magnetic field gradients in the directions x, y and z according to a rectangular coordinate system 11. For clarity, only gradient coils 5 and 6 are shown in FIG. 1, these serving together with a pair of opposite, identical gradient coils to generate a gradient in the x-direction. Identical gradient coils (not shown) for generating a gradient field in the y-direction lie parallel to the patient 10 as well as above and below the patient 10. Gradient coils for generating the gradient field in the z-direction lie at the head end and at the foot end transverse to the longitudinal axis of the patient 10.

The magnetic resonance system also has a radio-frequency antenna 7 employed for generating and for picking up magnetic resonance signals. The antenna 7, as a whole-body antenna, exhibits a homogeneous sensitivity in the examination volume in the reception mode. Local antennas 8a and 8b are additionally present, these being fashioned in this embodiment as part of an antenna array for examining the spinal column. The coils 1 through 4 bounded by a dot-dash line 9, the gradient coil system and the radio-frequency antenna represent the actual examination instrument that must be largely free of noise signals and that is surrounded by a radio-frequency shielding. The dot-dash line 9 is intended to symbolize the radio-frequency shielding.

The other components of the magnetic resonance system are arranged outside the radio-frequency shielding 9. A D.C. power supply 20 is provided for the operation of the magnetic coils 1 through 4. A gradient power supply 22 supplies the gradient coil system with the currents needed for building up and dismantling the gradient fields. Together, the gradient power supply 22 and the gradient coil system form the gradient system of the magnetic resonance system. The radio-frequency antenna 7 is connected via a transmission-reception separating filter 24 to a radio-frequency unit 26 for signal generation and pick-up. The radio-frequency unit 26 contains reception amplifiers 28 and a radio-frequency transmitter 30. The local antennas 8a, 8b are directly connected to separate reception channels of the radio-frequency unit 26. The operation of the magnetic resonance system is controlled by a control computer 32 to which a monitor 34 may be connected via an image computer (not shown). Among other things, the control computer 32 generates reference values for the gradient field that are referenced $G_x$, $G_y$ and $G_z$. The localization method described below also runs on the control computer 32.

FIG. 2 shows an example of an arrangement of a number of local antennas 8a through 8g at the body of a patient 10 in an examination space of a magnetic resonance system like that of FIG. 1. The local antennas 8a through 8g are arranged with the measurement region (FOV) of the gradient coil that is indicated by reference character 12. The patient 10 lies on the patient bed 13 and, after application of the local antennas 8a through 8g, is moved into the measurement region 12 with the patient bed 13. After positioning the patient 10 within the measurement region 12, the body 10 is excited by emitting a corresponding radio-frequency pulse with the whole-body antenna 7 so as to emit magnetic resonance signals. After the excitation, the signals emitted by the body are received by each local antenna 8a through 8g connected to the magnetic resonance system location-encoded in three coordinate directions with gradient fields generated by the gradient coils. Respective raw data rows along the axes x, y and z of the magnetic resonance system are thereby registered. The reception ensues simultaneously for all local coils. The location encoding need not necessarily ensue in the x-direction, y-direction or z-direction, but can ensue in an arbitrary spatial direction by means of a suitable drive of the gradient fields. Since the location encoding is reflected in the frequency spectrum in the magnetic resonance signal in the present example, the received magnetic resonance signals are subjected to a Fourier transformation in order to obtain correspondingly spatially resolved intensity values along the coordinate axes. After this Fourier transformation, each of the registered rows shows a projection of the subject in the x-direction, y-direction or z-direction convoluted with the coil profile (reception profile) of the respective local antenna.

As an example, FIG. 3 shows the curve of the intensity values of the magnetic resonance signals along the z-direction received with the local antenna 8f. As a comparison thereto, FIG. 4 shows the curve of the intensity values obtained in the same coordinate direction (z-axis) with the local antenna 8a.

Figure 5A:
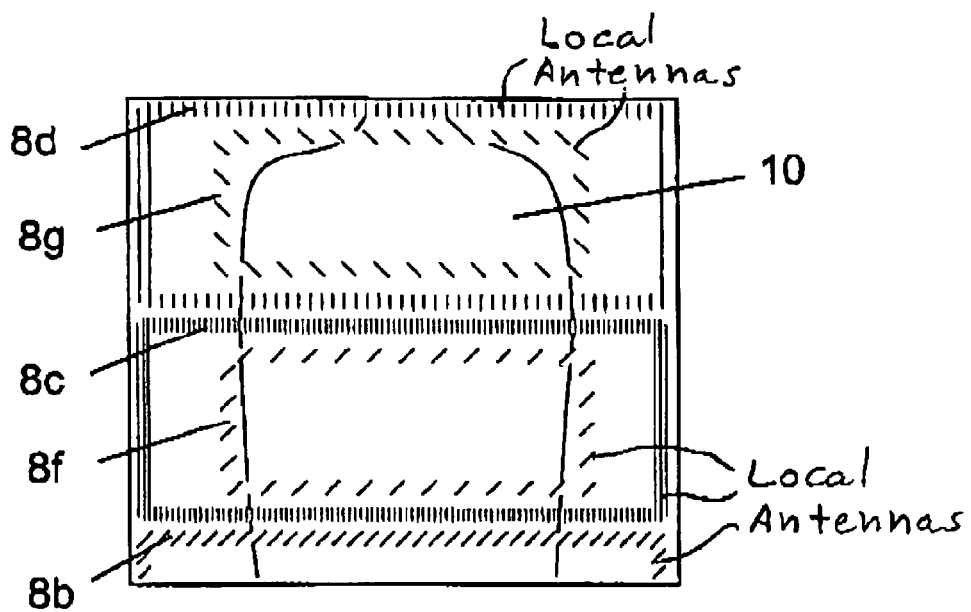
FIGS. 5A and 5B show an example of the mixing of the positions of the local antennas into a magnetic resonance overview presentation.
Figure 5B:
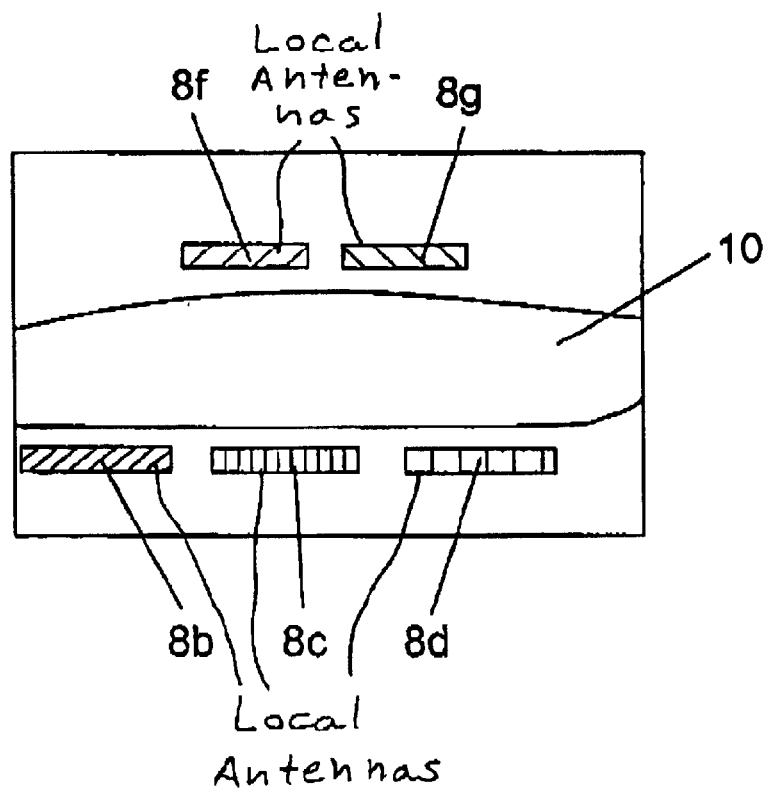

In the inventive method, a function is adapted to each identified intensity curve, this function corresponding to or being at least approximately adaptable to the shape of the reception profile of the allocated local antenna. A Gauss function 14 is utilized for this in the present case, this being able to be adapted well to the reception profile. As a result of a fit of the function 14 to the respective intensity curve in the relevant coordinate direction, as shown as an example for two antennas in FIGS. 3 and 4, the position of the respective antenna in the relevant coordinate direction can be obtained by utilizing the center of gravity 15 of the adapted Gauss function 14 as the antenna position on the respective coordinate axis. In the present example, this is implemented for all three orthogonal spatial directions and all participating local antennas 8a through 8g. In this way, the spatial position of the individual antennas 8a–8g in the examination space is obtained with high precision. Additionally, the half-width value 16 of the respectively adapted Gauss profile 14 in the intensity curves is identified and the illumination width of the respective antenna in the respective coordinate direction is derived therefrom. The position of the antennas can be subsequently mixed in an overview image, i.e. an overview exposure of the body region of the patient 10 to be examined, as can be seen as an example on the basis of FIGS. 5A and 5B. FIG. 5A shows a plan view onto an excerpt from the measurement volume 12. The patient body 10 as well as the local antennas 8b, 8c, 8d, 8f and 8g acquired in terms of their position can be seen in this illustration. The same antennas are mixed in, in a different perspective, in a sectional view shown in FIG. 5B that lies perpendicular thereto.

Figure 6:
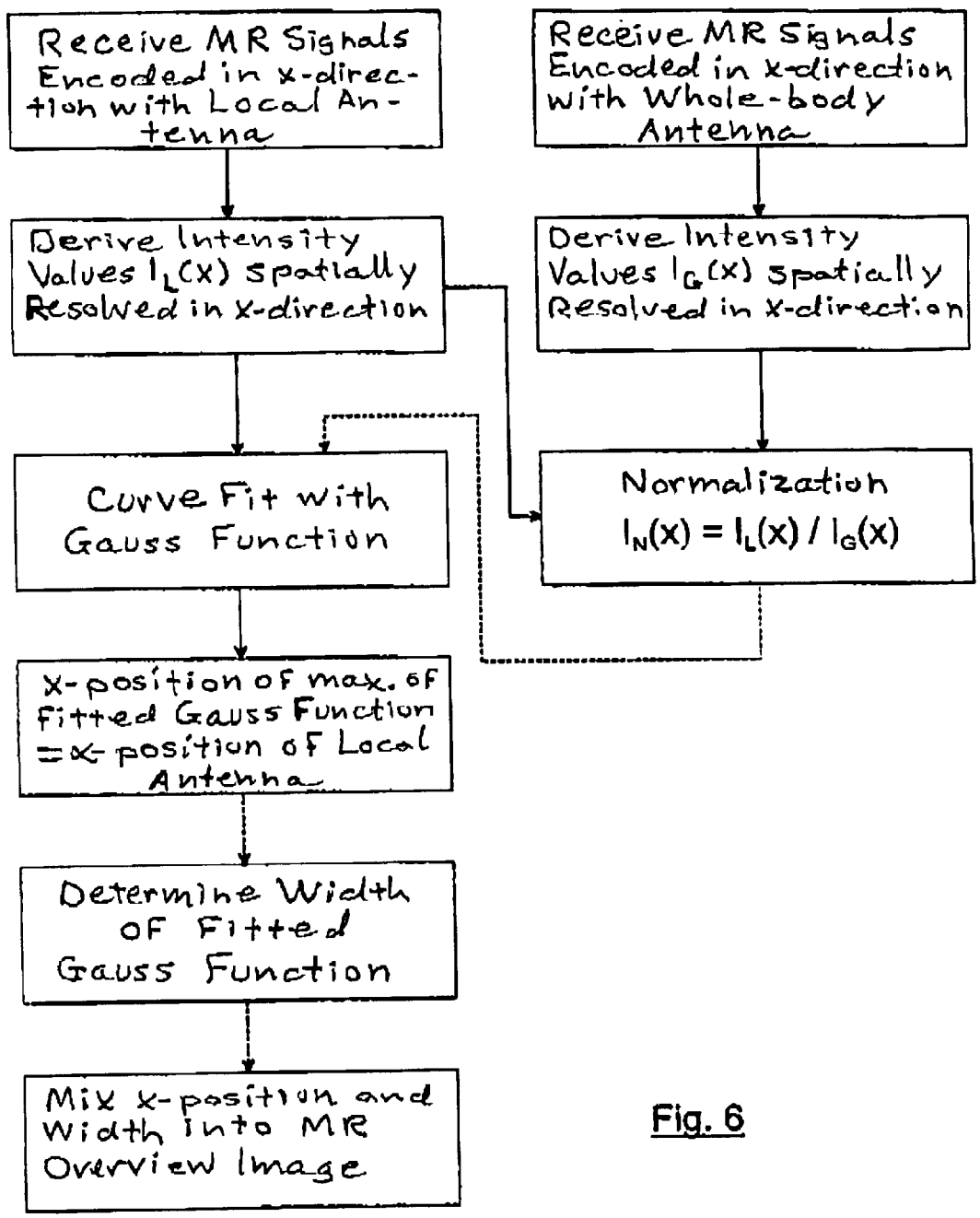
FIG. 6 is a flowchart for the inventive method.

FIG. 6 provides a schematic compilation of the basic sequence of the inventive method, wherein magnetic resonance signals encoded in a coordinate direction are received via the corresponding local antenna and converted into spatially resolved intensity values. The position of the respective local antenna can be determined by the position of the maximum of the adapted function by means of a fit with a function that can be manipulated to approximate the shape of the sensitivity profile of the antenna to the identified curve of the intensity values along the coordinate axis. Optionally, the same magnetic resonance signals can be simultaneously received with an antenna having a uniform reception profile and can be converted into corresponding intensity values. Subsequently, the intensity values obtained with the local antenna can be normalized to the intensity values acquired with the uniform antenna in order to obtain a normalized intensity curve that is independent of the shape and of the body material of the body situated in the examination space. The curve matching is then undertaken with this normalized intensity curve.

After implementation of the position determination in the desired coordinate directions and for the desired local antennas, the positions and—as needed—the illumination width of the corresponding local antennas are presented in a magnetic resonance overview image of the body to be examined. Referring to this presentation, the operator can select the proper coil for the subsequent measurement in order to obtain a maximum signal-to-noise ratio and minimal artifacts.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method for determining a position of a local antenna in an examination space of a magnetic resonance system, comprising the steps of:

(a) receiving a magnetic resonance signal emitted by a subject in an examination space of a magnetic resonance system with a local antenna having a sensitivity profile, said magnetic resonance signal being location-encoded in at least one coordinate direction of a coordinate system;

(b) from said magnetic resonance signal received by said local antenna, deriving a curve of intensity values that are spatially resolved along said coordinate direction;

(c) generating a function curve approximating said sensitivity profile of said local antenna, said function curve having a maximum;

(d) adapting said function curve to fit said curve of intensity values at a best fit location along said coordinate direction; and (e) identifying a position along said coordinate direction of said maximum of said function curve at said best fit location, as the position of said local antenna along said coordinate direction.

2. A method as claimed in claim 1 wherein the step of adapting said function curve comprises:

identifying a region of said curve of intensity values containing a maximum of said curve of intensity values; and adapting said function curve to fit said curve of intensity values only in said region.

3. A method as claimed in claim 1 wherein step (a) comprises receiving said magnetic resonance signals location-encoded in at least two coordinate directions of said coordinate system, and wherein step (b) comprises deriving a first curve of intensity values that are spatially resolved along a first of said at least two coordinate directions from said magnetic resonance signals received by said local antenna and deriving a second curve of intensity values that are spatially resolved along a second of said at least two coordinate directions from said magnetic resonance signals received by said local antenna, and wherein step (d) comprises adapting said function curve to fit said first curve of intensity values at a best fit location along said first of said at least two coordinate directions, and adapting said function curve to fit said second curve of intensity values at a best fit location along said second of said at least two coordinate directions, and wherein step (e) comprises identifying a position along said first of said at least two coordinate directions of said maximum of said function curve at said best fit location along said first of said at least two coordinate directions, as the position of said local antenna along said first of said at least two coordinate directions, and identifying a position along said second of said at least two coordinate directions of said maximum of said function curve at said best fit location along said second of said at least two coordinate directions, as the position of said local antenna along said second of said at least two coordinate directions.

4. A method as claimed in claim 1 comprising employing a Gauss function as said function curve.

5. A method as claimed in claim 1 comprising the additional steps of:

identifying a width of said function curve at said best fit location; and deriving a width of said sensitivity profile of said local antenna from said width of said function curve at said best fit location.

6. A method as claimed in claim 1 comprising the additional step of also receiving said magnetic resonance signals with an antenna having a uniform reception profile and generating a curve of intensity values that are spatially resolved along said coordinate direction from said magnetic resonance signal received by said antenna having a uniform reception profile, and generating a curve of intensity values that are spatially resolved along said coordinate direction exclusively from said magnetic resonance signal received by said local antenna, and wherein step (b) comprises generating said curve of intensity values that are spatially resolved along said coordinate direction from said magnetic resonance signal received by said local antenna by normalizing said curve of intensity values generated exclusively from said magnetic resonance signal received by said local antenna with respect to said curve of intensity values generated from said magnetic resonance signal received by said antenna having a uniform reception profile.

7. A method as claimed in claim 1 wherein step (a) comprises simultaneously receiving said magnetic resonance signals with a plurality of local antennas, including said local antenna, and conducting steps (b), (d) and (e) for each local antenna in said plurality of local antennas.

8. A method as claimed in claim 1 comprising the additional steps of:

from said magnetic resonance signals, generating and displaying a magnetic resonance overview image of said subject relative to said coordinate system; and mixing a representation of said sensitivity profile of said local antenna into said overview image at said position of said local antenna along said coordinate direction identified in step (e).

9. A method as claimed in claim 8 comprising the additional steps of:

identifying a width of said function curve at said best fit location;

deriving a width of said sensitivity profile of said local antenna from said width of said function curve at said best fit location; and employing said width of said sensitivity profile in said representation of said sensitivity profile mixed into said overview image.

10. A method as claimed in claim 1 comprising post-processing said intensity values prior to deriving said curve of intensity values in step (b).

* * * * *